United States Patent

Krinker et al.

[11] Patent Number: 5,998,984
[45] Date of Patent: Dec. 7, 1999

[54] METHOD AND APPARATUS TO TEST ELECTRIC CIRCUITS

[76] Inventors: Mark Krinker, 868 46 St., Brooklyn, N.Y. 11220; Ilya Stein, P.O.Box 191002, Brooklyn, N.Y. 11219

[21] Appl. No.: 08/990,218

[22] Filed: Dec. 14, 1997

[51] Int. Cl.⁶ .................................................. G01R 19/00
[52] U.S. Cl. .............................. 324/66; 324/133; 324/527
[58] Field of Search .................................... 324/537, 522, 324/527, 226, 239, 262, 133, 66, 67

[56] References Cited

U.S. PATENT DOCUMENTS

| | | | |
|---|---|---|---|
| 4,775,832 | 10/1988 | Pecukonis | 324/67 |
| 4,801,868 | 1/1989 | Brooks | 324/66 |
| 5,365,163 | 11/1994 | Satterwhite et al. | 324/67 |
| 5,457,441 | 10/1995 | Clement | 324/66 |

*Primary Examiner*—Diep N. Do
*Attorney, Agent, or Firm*—Ilya Zborovsky

[57] ABSTRACT

In order to place contour portions of an electric circuit, a local scanning curl electric shield acts on the electric circuit so as to induce an electromotive force on the electric circuit, an electric circuit is connected with a light source emitting light strobes so that in response to maximum or minimum values of the electromotive force electric strobe pulses are generated.

16 Claims, 3 Drawing Sheets

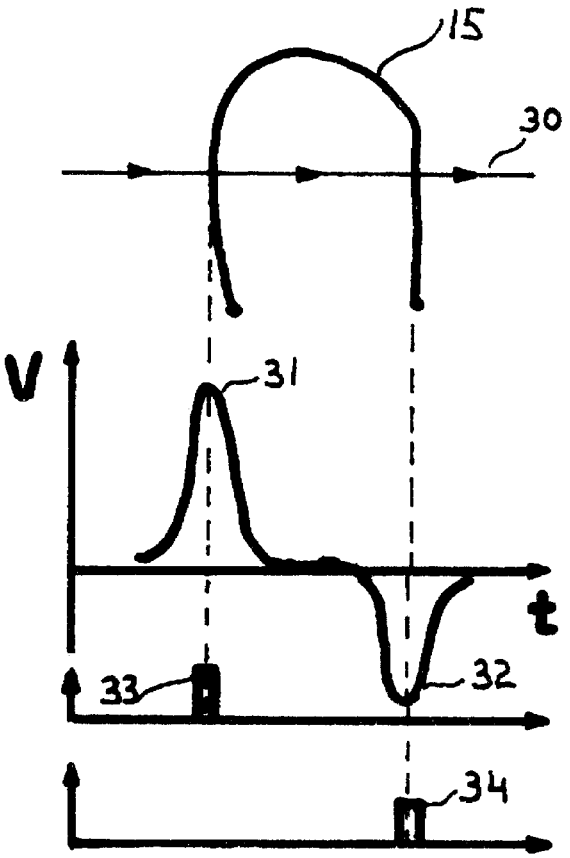
FIG. 2a
FIG. 2b
FIG. 2c
FIG. 2d
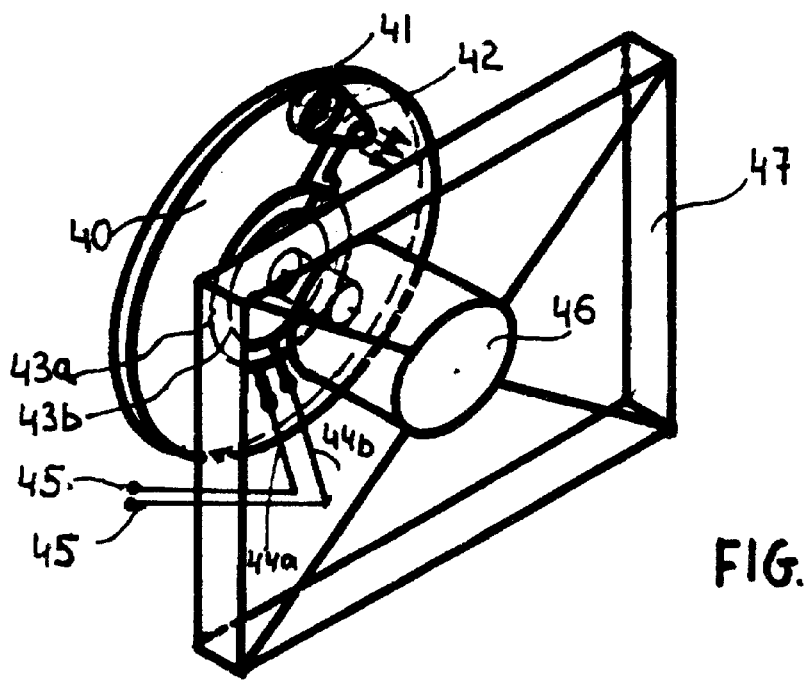
FIG. 3

METHOD AND APPARATUS TO TEST ELECTRIC CIRCUITS

BACKGROUND—FIELD OF INVENTION

This invention relates generally to electrical circuit troubleshooting, and more specifically, to inductive testing, tracking, or tracing of electric circuits.

BACKGROUND—DESCRIPTION OF PRIOR ART

The problem of an electric circuit tracing exists in electrical engineering in various applications including applications related to troubleshooting and reverse engineering. One tracing technique, known as inductive tracing, is based on inducing electric voltage driven by an alternative current that passes through a traced circuit. The circuit path is traced by detection of the induced electrical signal by a receiving coil, and with further measurement and indication of intensity of the induced signal that gives information about position of the traced conductive wire portion. In prior art, U.S. Pat. No. 5,457,441 to Clement discloses an inductive tracer that amplifies an electrical signal induced in a detecting coil or sensor. U.S. Pat. No. 4,801,868 to Brooks discloses a circuit tracing apparatus and method based on receiving low frequency RF signal driven by a transmitter plugged into a power line under test.

There are certain drawbacks inherent in the named prior art. The inductive tracing requires passing alternating current of relatively high frequency to get a sufficient induced voltage in the circuit tracing device. The high frequency current causes undesirable displacement current to flow through capacitors, resulting in detection of false branches of a circuit that have no DC-conductivity. Beside that, the known methods do not provide sufficiently convenient means of visualization of a circuit being traced, which results in reduced information value and increased time of circuit analysis. Therefore, known methods suffer a number of disadvantages:

(a) They require passing heavy probing current through a circuit being traced, which is harmful to the circuit's electronic components.

(b) High-frequency probing current is required to provide sufficiently strong induced signals in a receiving sensor, which creates unwanted displacement currents in the circuit and its components and diminishes reliability of circuit tracing and testing.

(c) The spatial resolution of a certain circuit tracing apparatus depends on geometric characteristics of the receiving sensor.

(d) Convenient spacial visualization of a circuit being tested is not obtainable in prior art.

(e) Methods and apparatus of prior art do not differentiate outgoing and/or incoming branches of the circuit.

SUMMARY OF THE INVENTION

Accordingly, taking into consideration recited features of the prior art, several objects and advantages of the present invention are:

(a) to reduce a probing current that flows through a circuit being tested;

(b) to increase reliability of circuit tracing process by decreasing operational current frequency and harmful displacement current;

(c) to increase the spatial resolution and circuit visualization;

(d) to visualize locations of different parts of a circuit being traced;

(e) to provide color marking of outgoing and incoming portions of the circuit under test.

In the method disclosed in this invention, a circuit under tracing is sequentially scanned by a local scanning curl electric field, which is defined as the curl electric field created by a magnetic field source that moves in the presence of the conducting electric circuit contour being traces, and the area encompassed by the circuit contour is greater than the surface area of the source of the magnetic field. The local scanning curl electric field induces electromotive force (emf) across the circuit being traced. When the induced emf reaches its maximum peak value, an electric strobe pulse forms with simultaneous conversion of the electric strobe pulses into visible pixels of strobe light beams. The light beams are further superimposed on the source of the local scanning curl electric field.

BRIEF DESCRIPTION OF THE DRAWINGS

FIG. 1$b$ is a front view of a scanner of the basic version.

FIG. 1$c$ is a side view of a scanner of the basic version.

FIG. 1$d$ is a distribution of magnetic field of the magnets of the basic version.

FIG. 2$a$ shows a trace of scanning closed electric circuit.

FIG. 2$b$ is an electric diagram of pulses obtained during scanning an electric circuit.

FIGS. 2$c$ to 2$d$ show diagrams of strobe electric pulses obtained from the bi-polar electric pulses shown in FIG. 2$b$.

FIG. 3 shows an alternative embodiment of the scanning unit that has a spinning disc with one magnet element and a light-emitting element attache to the surface of the magnet element.

DESCRIPTION OF THE PREFERRED EMBODIMENTS—FIGS. 1 TO 4

Figure 1A:
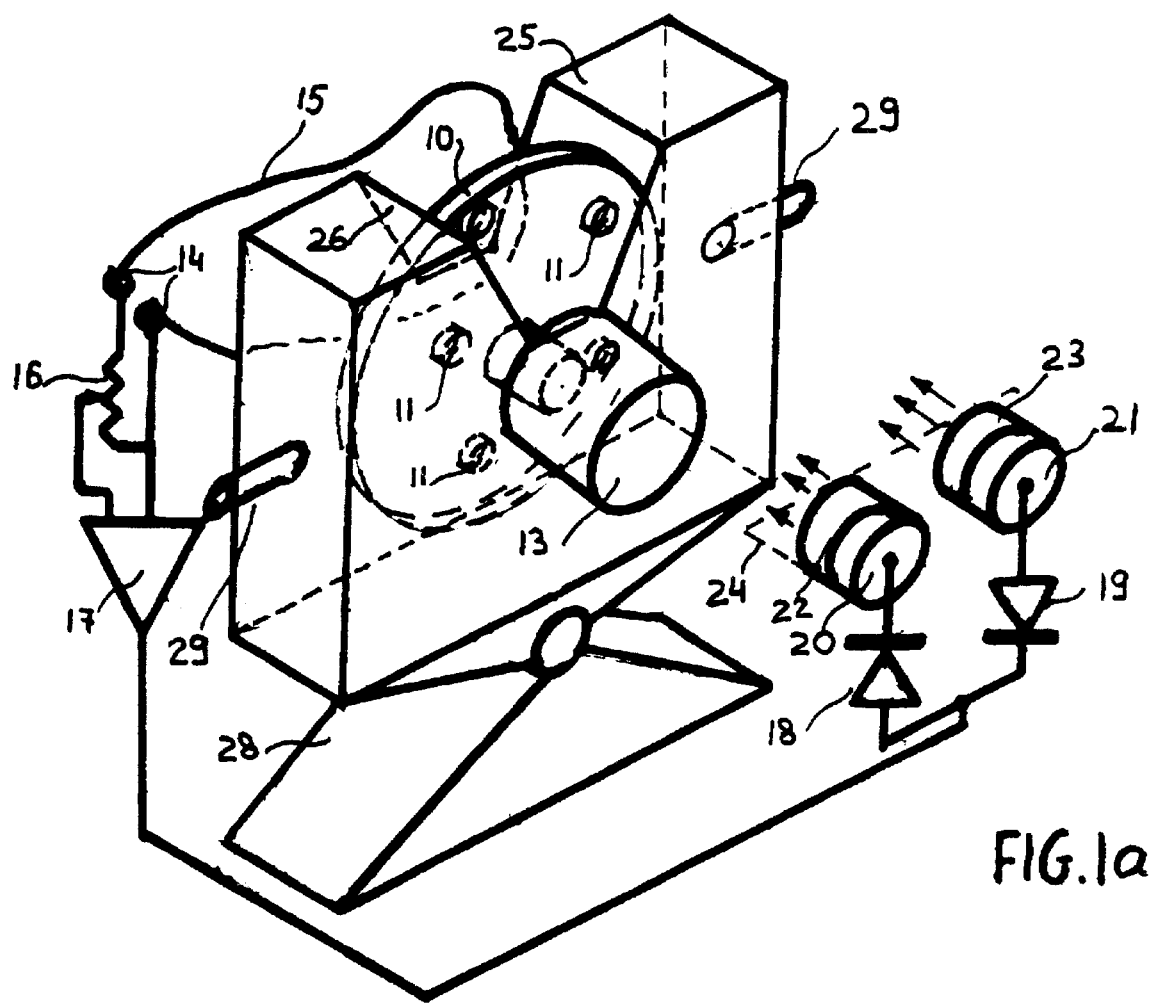
FIG. 1$a$ is a schematic unit and circuit diagram of the preferred embodiment of the method and imager apparatus.
Figure 1B:
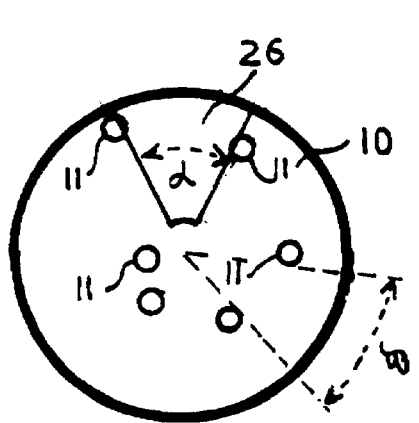
Figures 1C, 1D:
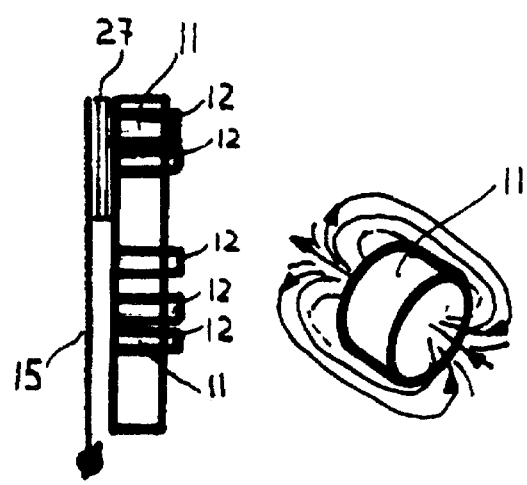

A preferred embodiment of the present invention, shown in FIGS. 1$a$ to 1$d$, comprises a light-transparent disc 10 with a plurality of spirally-arranged scan magnet elements 11, a motor 13, terminals 14 connected to circuit 15 under test, a potentiometer 16 coupled to terminals 14, an amplifier 17, diodes 18 and 19 coupled to amplifier 17, an electrical strobe pulse generator comprised of diodes 18 and 19 coupled to electric strobe pulse formers 20 and 21, two color strobe light sources 22 and 23 connected to outputs of strobe pulse formers 20 and 21, a grounded electric grid-shield 24, a magnetic shield 25 with an opening 26, a transparent window 27 and a movable stand 28 with handles 29. The spiral arrangement of magnets 11 on the transparent scanning disc 10 is separately shown in FIGS. 1$b$ and 1$c$. Each magnet 11 is a local source of the magnetic field. Surface 12 of magnets 11 has light-scattering property.

FIG. 1$d$ shows direction of magnetic field of scan magnets 11.

FIG. 2$a$ shows scanning of circuit 15 along direction 30.

FIG. 2$b$ shows time (t) and voltage (V) dependence of bi-polar electric pulses 31 and 32 induced in circuit 15 when magnet 11 scans over electric circuit 15 along direction 30.

FIG. 2$c$ shows electric strobe pulse 33 generated by electric strobe pulse former 20 from electric pulse 32.

FIG. 2d shows the electric strobe pulse 34 formed by the electric strobe pulse former 21 from electric pulse 32.

The simplified embodiment of the scanning unit is shown in FIG. 3. This version provides a circular scan by one magnet 41 and does not use the magnetic shield. It comprises a light-transparent disc 40, one magnet 41 placed on said disc, bi-color light-emitting diode (LED) 42 placed on the surface of the magnet 41, metal rings 43a and 43b connected to the LED, electric brushes 44a and 44b, terminals 45, a motor 46 on a frame 47.

Figure 4:
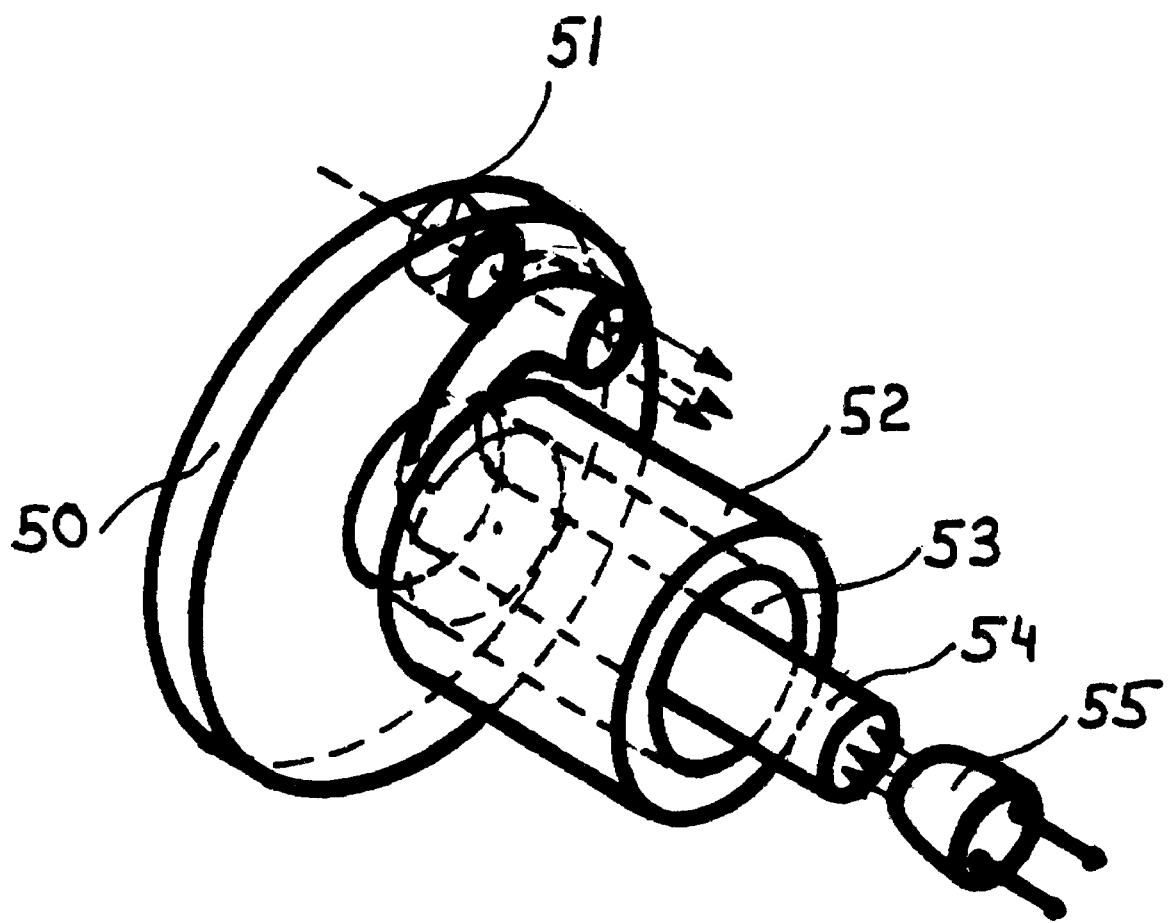
FIG. 4 is another embodiment of the scanning unit that has a waveguide for the irradiating light.

FIG. 4 shows another version of the scanning unit that comprises a transparent disc 50, a magnet 51, a motor 52 with a hollow shaft 53, an optic waveguide 54, and a LED 55.

The preferred embodiment of a circuit tracing apparatus, shown in FIG. 1a, works as follows. When disc 10 spins, magnet 11 drives traveling curl electric field in the surrounding media. This curl electric field induces emf E across circuit 15 according to the law E=−N Df/dt, where N is the number of turns of the circuit wire, and F is the magnetic flux. In most cases a circuit being traced comprises one wire turn, in which case N=1. The voltage across terminals 14 of circuit 15 is defined by emf E and by impedance of circuit 15 and potentiometer 16.

When magnet element 11 passes in opening 26, the magnet element induces emf across circuit 15. Due to screening action of magnetic shield 25, emf across circuit 15 is induced only when magnet 11 passes inside the area of opening 26. A radial angle α of opening 26 is smaller than a radial angle β between any two adjacent magnet elements 11. Therefore no two magnets 11 can appear at the same time in opening 26. Arrangement of magnet elements 11 on the disc 10 is shown in FIG. 1b. Each magnet element 11 creates a distinct line of light pixels that visually corresponds to a location of one circuit fragment.

FIGS. 2a to 2d show voltage change of electric pulses while scanning the electric circuit.

FIG. 2a shows direction 30 along which magnet 11 scans circuit 15. Magnet element 11 crosses over a portion of circuit 15 and induces pulses of emf that create voltage in circuit 15. The voltage induced in circuit 15 peaks at values 31 and 32 exactly when derivative of magnetic inductance in circuit 15 reaches a maximum value. The voltage pulses have opposite polarities because the derivative of the magnetic flux changes sign when magnets 11 pass over the opposite sides s1 and s2 of circuit 15. The electric signal induced by emf in circuit 15 enters, through terminals 14, potentiometer 16 and amplifier 17. From amplifier 17, electric current pulse 31 passes through diode 18 to the input of electric strobe pulse former 20, while electric current pulse 32 passes through diode 19 to electric strobe pulse former 21. Electric strobe pulse formers 20 and 21 derive electric strobe pulses 33 and 34 exactly when voltage pulses 31 and 32 reaches their maximum peaks correspondingly. Voltage pulses 31 and 32 activate strobe light sources 22 and 23 when magnet 11 crosses circuit 15, causing light sources 22 and 23 to emit light that illuminates light-scattering surface 12 of magnet 11. The scattered light creates an image sequence of pixels. The image looks as if it was superimposed on the circuit being traced. The color of the image line on a branch of circuit 15 depends on whether said branch belongs to outgoing or incoming portion of the circuit being traced.

Electric grid-shield 25 serves to prevent the influence of electromagnetic interferences of strobe lights 22 and 23 on the circuit being tested. The voltage across amplifier 17 input triggers voltage in the rest of the circuit, said voltage depends on the emf and ratio between circuit 15 resistance and potentiometer 16 shoulders. This dependance can be used to estimate the impedance of the circuit being traced and compare said impedance with impedance of other branches of the circuit.

Shown in FIG. 3 shows a single-line scanning unit that has only one magnet element. This is a simplified alternative embodiment, while the preferred embodiment represents a multi-line imager apparatus. This single-line imager allows to make a complete circular scan of the area in which the circuit contour is located. Because a single magnet element 41 is used, no magnetic shield is required. The basic physical process is similar to that of the basic version shown in FIG. 1a. When magnet 41 passes over a portion of the circuit being tested, the electric pulse voltage is induced. Like in FIG. 1a, this voltage is further amplified. Through terminals 45 and electric brushes 44a and 44b, this voltage is applied to spinning metal rings 43a and 43b which are coupled to a bi-polar LED 42 placed on magnet 41. Bi-color LED 41 consists of two monochrome LEDs connected in anti-parallel way to each other. When disc 40 spins, LED 41 emits bursts of light pulses every time magnet 41 crosses over the circuit being tested. The color of the light pixel depends on incoming or outgoing direction of path-tracing of the circuit. Due to this, a viewer sees color pixels superimposed on the circuit under test.

Shown in FIG. 4 is another embodiment of the single-line scanner. An optical waveguide 54 is inside of a hollow shaft 53 of motor 52. In this embodiment, the bursts of light from LED 55 travel trough waveguide 54. Optical waveguide 54 spins around its long axis inside of motor 52. The hollow shaft 53 turns disc 50 that has magnet 51. The physical principle of tracing the circuit is described in the preferred embodiment.

Furthermore, the method and apparatuses to make an electric circuit visible have advantages as follows:

- it reduces a probing current that flows through circuit being tested;
- it reduces operating frequency and caused by its unwanted displacement current;
- it increases the spatial resolution;
- it reproduces the entire image of a closed circuit being traced;
- it provides bi-color marking of outgoing and incoming portions of the circuit.

Although the description above contains many specificities, these should not be construed as limiting the scope of invention but as merely providing illustration of some of the presently preferred embodiments of this invention.

The imager apparatus with a single magnet element 41 positioned on disc 40 does not require the magnetic screen with an opening. The magnetic screen with an opening is required, however, in the embodiment of the imager apparatus with more than one magnet element 11, as shown in FIG. 1.

The circuit imager apparatus shown in FIG. 1a can employ a plurality of LEDs, connected in parallel with each LED located on the surface of a corresponding magnet element, with use of the electric brushes and metal rings to transmit the pulses to the LEDs. To get bi-color image, the LEDs with two built-in different color LEDs connected in anti-parallel way can used.

Beside the electric brushes and metal rings, other means can be used to transmit electric signal to the LEDs. For example, a spun transformer that has its primary winding motionless around the motor shaft, and its secondary winding placed on the spinning disc.

A multi-line circuit imager apparatus can employ an optical waveguide as exemplified in FIG. 4. In this case, optical waveguide splits into the branches that are superimposed on the magnet elements, similar to what is shown in FIG. 4. Another ramification is that convex mirrors, with generally spherical surface, can be employed instead of the light-scattering material of the magnet elements. The mirrors provide more efficient reflecting of light than light-scattering coat of the magnet elements and permit employment of less powerful light sources. Without regard to a method used to superimpose the strobe light pulses onto the scan magnets in a multi-line imager, the multi-line circuit imager must have a magnetic shield with the cut-out opening as illustrated by FIG. 1.

Having described the preferred embodiments of disclosed invention, it should now be apparent to those skilled in the art that certain advantages of the method and circuit imaging device have been achieved. It should be also appreciated by those skilled in the art that various modifications, adaptations, and alternative embodiments thereof may be made within scope and spirit of the present invention. The present invention is further defined by the following claims.

What is claimed is:

1. A method of tracing contour portions of an electric circuit, comprising the steps of connecting a light source adapted to emit light strobes to the electric circuit; acting on the electric circuit by local scanning curl electric field so that when the local scanning curl electric field intersects the electric circuit an electromotive force is induced across the electric circuit and a maximum or a minimum value of the electromotive force causes the emission of light strobes by the light source, and said light source illuminates points at which the electric circuit is intersected by the local scanning curl electric field.

2. A method as defined in claim 1, and further comprising the steps of determining an instance of time when the electromotive force across the electric circuit reaches its peak value and using electric strobe pulses of the light strobes to form an electric strobe pulse when the peak value of the electromotive force occurs.

3. A method as defined in claim 1, wherein said illuminating includes marking a contour of branches of the electric circuit by superimposed light pixels of different colors, depending on outgoing or incoming direction of the branches.

4. A method as defined in claim 1, and further comprising separating electric strobe pulses of the light strobes into two groups, depending on polarity of the induced electromotive force; using electric strobe pulses of the light strobes of a first of the groups to trigger the emission of a strobe light of a first color; and using the electric strobe pulses of the light strobes of a second of the groups to trigger the emission of a strobe light of a second color, said first color being different from the second color.

5. A method as defined in claim 1, and further comprising the step of directing the strobe lights to a viewer.

6. A method as defined in claim 1, and further comprising the step of directing the strobe lights to a visualization screen.

7. A device for tracing contour portions of an electric circuit, comprising means for emitting light strobes by a light source; and means for acting by local scanning curl electric field on the electric circuit so that when the local scanning curl electric field intersects contour portions of the electric circuit an electromotive force is induced across the electric circuit and triggers the emission of the light strobes by said light source.

8. A device as defined in claim 7, wherein said means for acting include a disc provided with at least one local magnetic field source and spinning around an axis; and further comprising means for spinning said disc.

9. A device as defined in claim 8, and further comprising an electromagnetic shield with an opening inside of said electromagnetic shield, so that no two of the local magnetic field sources can appear simultaneously inside said opening, said electromagnetic shield and said power means for spinning said disc being located on mutually opposite sides of said disc.

10. A device as defined in claim 7, and further comprising a potentiometer with an input terminal connected to said electric circuit.

11. A device as defined in claim 10, and further comprising an amplifier with an input connected to an output of said potentiometer.

12. A device as defined in claim 7, wherein said means for emission of light strobes is formed to emit strobe lights of two different colors.

13. A device as defined in claim 9, and further comprising at least one handle for moving the device so that light contours of outgoing and incoming branches of the electric circuit are reproduced when the electric circuit is placed in front of said electromagnetic shield.

14. A device as defined in claim 7, wherein said acting means include magnet elements having a light-scattering surface.

15. A device as defined in claim 14, wherein said magnet elements are arranged on a disc so that each of said magnet elements produces a magnetic field essentially normal to said disc.

16. A device as defined in claim 14, wherein said light-scattering surface is formed as a convex mirror having a generally round surface.

* * * * *